United States Patent
Knowles

(10) Patent No.: US 6,507,141 B2
(45) Date of Patent: *Jan. 14, 2003

(54) INERTIAL RATE SENSOR TUNING FORK

(75) Inventor: Stuart J. Knowles, Walnut Creek, CA (US)

(73) Assignee: BEI Technologies, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/827,886

(22) Filed: Apr. 6, 2001

(65) Prior Publication Data

US 2001/0054860 A1 Dec. 27, 2001

Related U.S. Application Data

(62) Division of application No. 09/396,996, filed on Sep. 15, 1999.

(51) Int. Cl.[7] .............................................. H01L 41/08
(52) U.S. Cl. ...................................................... 310/370
(58) Field of Search ........................... 310/329, 323.01, 310/366, 367, 370; 73/1 D, 505, 517 R, 517 A, 517 AV

(56) References Cited

U.S. PATENT DOCUMENTS

| 2,195,417 | A | * | 4/1940 | Mason ........................ 310/370 |
|---|---|---|---|---|
| 3,437,850 | A | * | 4/1969 | Bunger .................... 310/370 X |
| 3,683,213 | A | * | 8/1972 | Staudte ........................ 310/370 |
| 3,697,766 | A | * | 10/1972 | Ganter et al. ................ 310/370 |
| 4,379,244 | A | | 4/1983 | Dinger |
| 4,724,351 | A | * | 2/1988 | EerNisse et al. ............. 310/328 |
| 5,396,144 | A | * | 3/1995 | Gupta et al. ................. 310/370 |
| 5,426,970 | A | * | 6/1995 | Florida et al. ................ 73/1 D |
| 6,262,520 | B1 | * | 7/2001 | Knowles ...................... 310/370 |

FOREIGN PATENT DOCUMENTS

| EP | 821481 | 1/1998 |
|---|---|---|
| JP | 52-39391 | 3/1977 |
| JP | 53-79486 | 7/1978 |
| JP | 54-37488 | 3/1979 |
| JP | 55-21679 | 2/1980 |
| JP | 56-94813 | 7/1981 |
| WO | 9626445 | 8/1996 |

* cited by examiner

*Primary Examiner*—Mark O. Budd
(74) *Attorney, Agent, or Firm*—Edward S. Wright

(57) ABSTRACT

Vibratory tuning fork having a body of piezoelectric material with a base and a pair of tapered tines which extend from the base and decrease in lateral dimension from the base toward the tips of the tines. A crotch section at the base of the tines has an inner pair of faces which lie in crystallographic planes of the piezoelectric material and an outer pair of faces which lie in additional crystallographic planes of the material and extend between the inner pair of faces and the tines. An isolation slot is formed in the base adjacent to the crotch, with enlarged cut-outs at the ends of the slot to prevent the formation of facets and membranes across the slot.

8 Claims, 3 Drawing Sheets

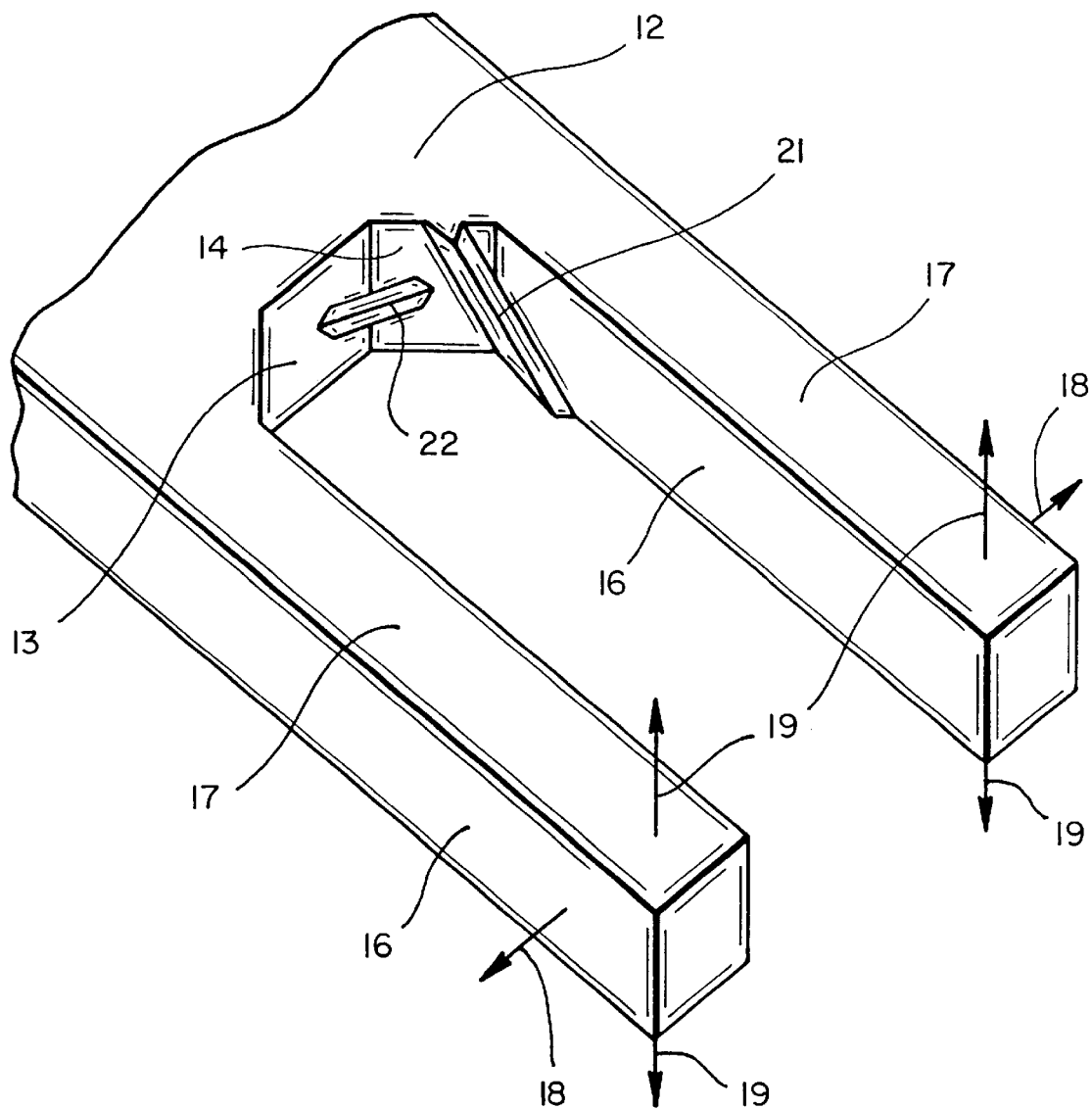
FIG_1
(PRIOR ART)

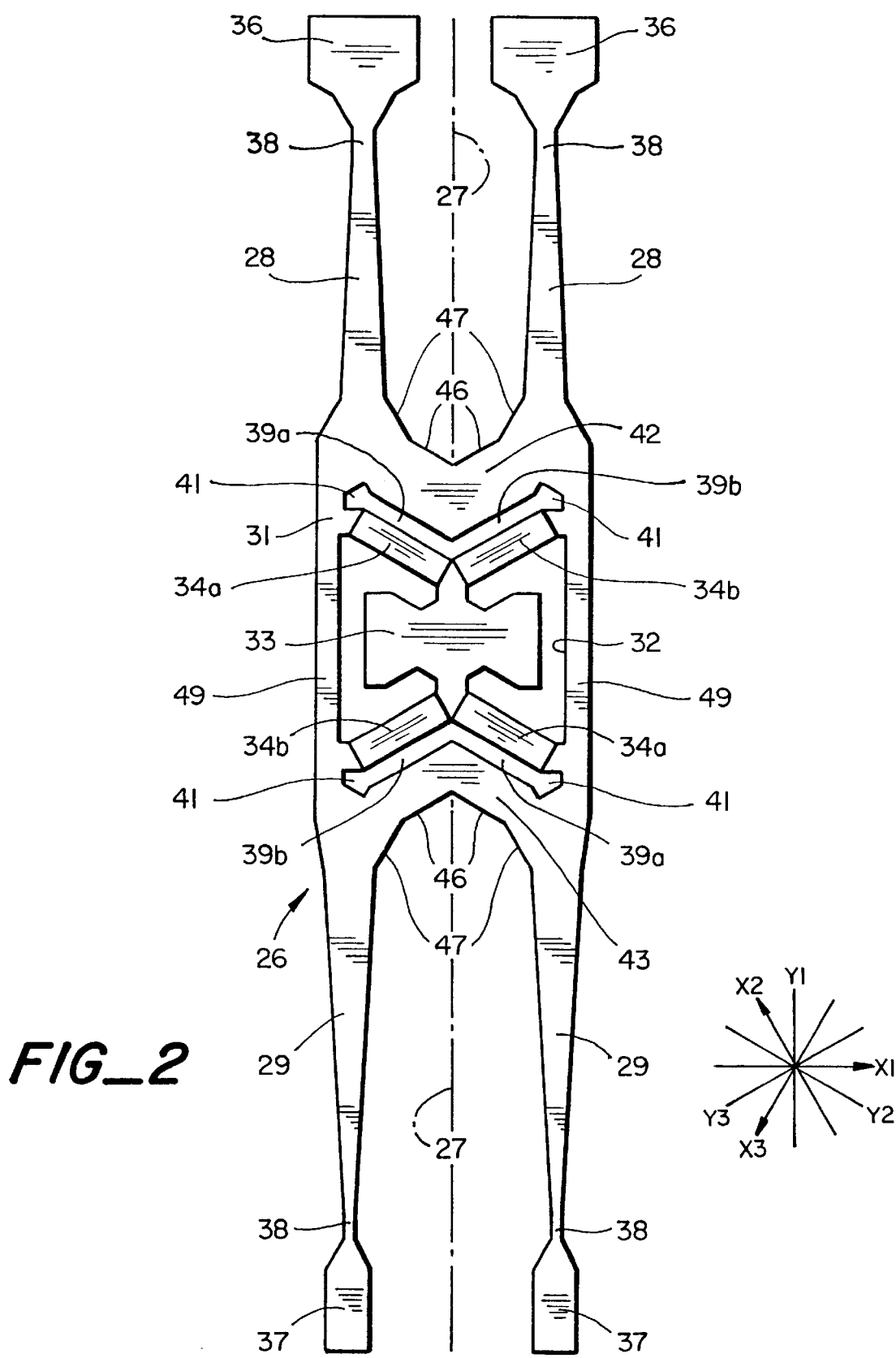
FIG_2

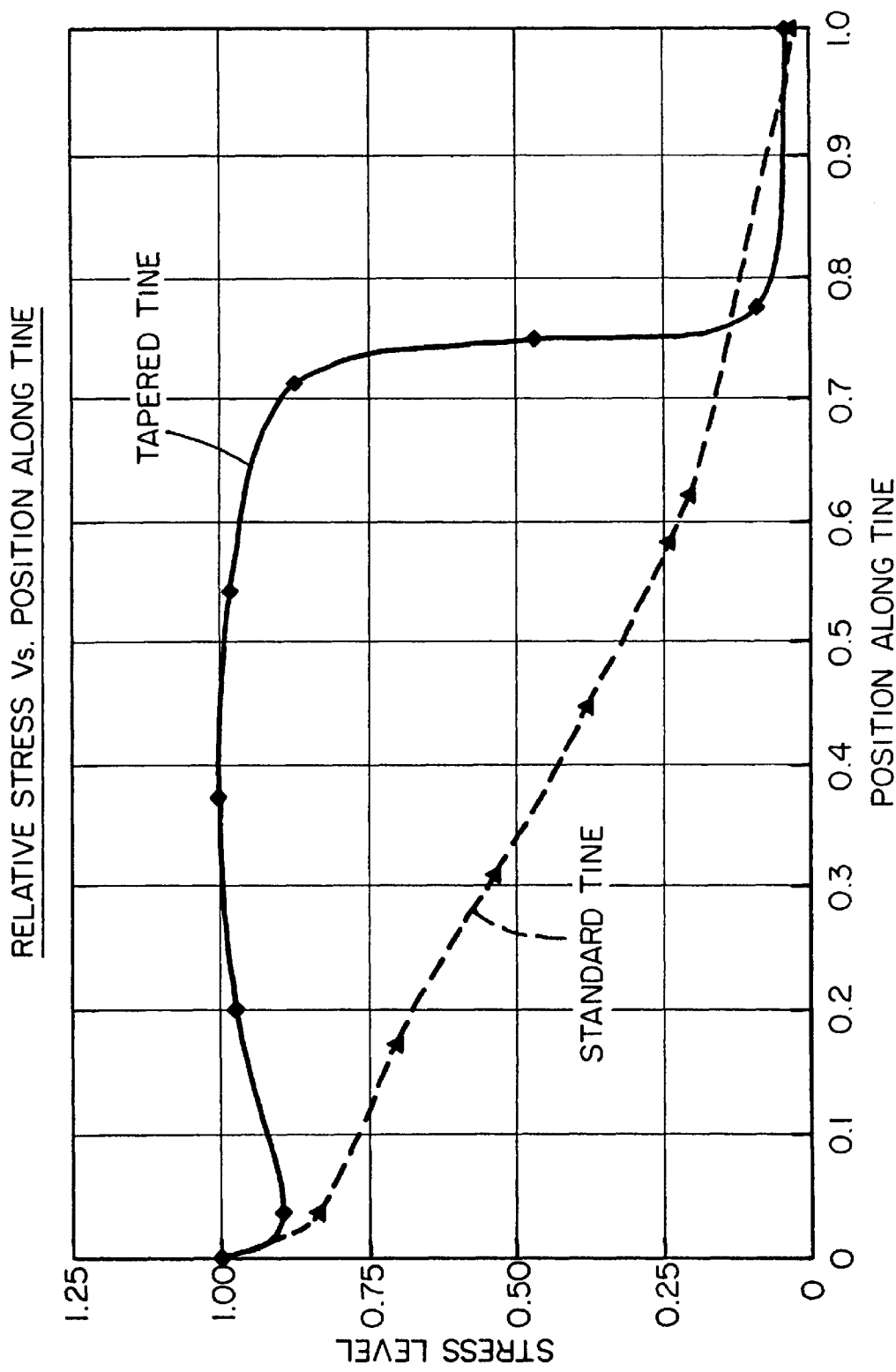
FIG_3

INERTIAL RATE SENSOR TUNING FORK

This a division of Ser. No. 09/396,996, filed Sep. 15, 1999.

This invention pertains generally to inertial rate sensors such as rotation rate sensors and, more particularly, to a vibratory tuning fork for use in an inertial rate sensor.

As illustrated in FIG. 1, vibratory quartz tuning forks heretofore provided for use in inertial rate systems have included a pair of elongated tines 11 of constant rectangular cross section joined together at a crotch 12 which consists of a central segment 13 that is perpendicular to the axis of the device and one or more pairs of additional segments 14 which interconnect the first pair of segments and the tines. One example of such a tuning fork is found in European Patent Application No. EP 0 821 481 A2. A double ended tuning fork with straight tines of constant rectangular cross section is shown in U.S. Pat. No. 5,366,194.

In these tuning forks, the side faces 16 of the tines are parallel to each other throughout the length of the tines, as are the top and bottom faces 17. A tuning fork having this geometry has two fundamental lateral modes of vibration, one designated by the arrows 18 parallel to the plane of the fork, the other designated by the arrows 19 perpendicular to the plane of the fork. When the fork is resonating in either mode, the maximum stress on any face is generated at the base of face, and the minimum is generated at the tip. The distribution of the stress along the face is not linear, but rather is concentrated near the base, so that most of the outer portion of the face is at a low stress level. Furthermore, the local stress level in the corners where the crotch joins the tines is even higher due to the geometry of the fork and faceting which tends to occur with that geometry. Ignoring that concentration, the distribution of stress along the tines is approximately as follows:

| Distance From Crotch (%) | Stress Level (%) |
|---|---|
| 0 | 100 |
| 20 | 73 |
| 40 | 46 |
| 60 | 23 |
| 80 | 6.4 |
| 100 | 0 |

Since quartz is piezoelectric, the stress at the face of the tine results in charge being developed on the surface, which can be collected by an electrode. Conversely, stress can be created by applying an electrical potential to the electrode. The magnitude of the charge produced is proportional to the integral of the stress and the area of the face.

This standard tine geometry has several disadvantages which limit performance of the tine. Due to manufacturing inaccuracies and faceting which can occur when a crystalline material is chemically etched, the cross sections of most tines are not truly rectangular. These errors cause the fundamental vibration mode to be aligned at an angle to the plane of the fork, rather than being aligned precisely with it. The facets will often be the largest in the corners between the crotch and the tines, as indicated at 21, where the stress is the highest and the facets have the greatest effect on the angle of tine deflection.

Also, with most of the charge being developed near the base of the tines, electrodes which extend along the length of the tines are inefficient. The outer portions of the electrodes are largely ineffectual due to the low stress levels toward the tips of the tines.

Another problem with the standard tine geometry is the high stress level at the junction of the crotch and the tines, which is increased even further by the stress concentration at that point. In order for the fork not to fracture, the maximum stress at the junction must be kept below the fracture strength of the fork material. Since the stress along the tines is considerably less than the level near the crotch, the charge available from the electrodes is also severely limited.

Moreover, the design of the tines is somewhat limited in flexibility, due to the fixed relationships between length, width, thickness and frequency. Thus, for example, given certain thickness and frequency requirements, only the length and width can be varied. Since frequency is proportional to the relationship of length and width, the design of the fork is limited to only a few variations. This permits very limited optimization of performance.

The central segment 13 in the crotch section of prior art tuning forks presents a further problem in that undesirable bridging facets 22 tend to form between that segment and the segments 14 next to it. Such facets tend to span an entire crotch segment or face. In addition, the presence of the central section limits the length of the other segments, which also tends to cause bridging.

It is in general an object of the invention to provide a new and improved tuning fork for use in an inertial rate sensor.

Another object of the invention is to provide a tuning fork of the above character which overcomes the limitations and disadvantages of tuning forks heretofore provided.

These and other objects are achieved in accordance with the invention by providing a tuning fork which has a body of piezoelectric material with a base and a pair of tapered tines which extend from the base and decrease in lateral dimension from the base toward the tips of the tines. A crotch section at the base of the tines has an inner pair of faces which lie in crystallographic planes of the piezoelectric material and an outer pair of faces which lie in additional crystallographic planes of the material and extend between the inner pair of faces and the tines. An isolation slot is formed in the base adjacent to the crotch, with enlarged cut-outs at the ends of the slot to prevent the formation of facets and membranes across the slot.

FIG. 1 is a fragmentary isometric view of a prior art tuning fork of the type to which the invention pertains.

FIG. 2 is top plan view of one embodiment of a tuning fork incorporating the invention.

FIG. 3 is a graphical representation of the relative stress levels along tapered and untapered tines.

The double ended tuning fork 26 illustrated in FIG. 2 is fabricated from a wafer of quartz material with the tuning fork lying in the x—y plane of the quartz and the longitudinal axis 27 of the fork aligned with the y-axis of the quartz (designated Y1). The positive x-axis of the quartz (designated X1) is perpendicular to the longitudinal axis, and the z-axis of the quartz extends vertically, perpendicular to the x—y plane. This fork has a pair of tapered drive tines 28 at one end and a pair of tapered pick-up tines 29 at the other.

Due to its trigonal crystal structure, the quartz has two more x-axes (designated X2 and X3) which are oriented at angles of +120 degrees and −120 degrees relative to the X1 axis in the plane of the tuning fork. There are also two more y-axes (designated Y2 and Y3) which are oriented at angles of +120 and −120 relative to the Y1 axis and spaced equally between the x-axes. Thus, there are x-axis surfaces every 60 degrees and y-axis surfaces between them, with a progression of crystallographic planes +x, +y, −x, −y, +x, . . . at 30 degree intervals.

The body of the tuning fork includes a frame 31 in which a central opening 32 is formed. A mounting pad 33 is located in the opening and connected to the frame by relatively thin bridges 34 at opposite ends of the opening. Each of the bridges has a V shape in plan view, with sections 34a, 34b extending at angles of about 60 degrees to the axis of the tuning fork in directions parallel to the Y2 and Y3 axes of the quartz.

Tines 28, 29 extend from the frame in a direction-parallel to the y-axis of the quartz, and decrease in lateral dimension from the frame toward the tips of the tines. The angle of the taper is on the order of 1 to 5 degrees, with a preferred range of about 1.4 to 3.8 degrees. The taper is such that when the tines are driven at resonance, the stress level is relatively uniform along the length of the tines. This can be seen in FIG. 3 where the stress distributions along tapered and untapered tines are compared. The more uniform stress distribution produces a more uniform charge distribution along the tines and results in a more efficient tuning fork than the prior art devices where the stress is concentrated toward the base of the tines.

Increased masses or weights 36, 37 are formed at the tips of the tines and connected to the tapered portions of the tines by short, straight neck sections 38. The weights offset some of the effects of the tapered tines, i.e., the increase in resonant frequency and the decrease in total momentum. By adjusting the angles of tine taper, the size and shape of the masses at the tips, and the lengths and widths of the tines, the performance of the tuning fork can be optimized.

Isolation slots 39 are formed in the body of the tuning fork between the bridges and the tines. These slots are relatively narrow and are V-shaped, with sections 39a, 39b extending in the directions of the Y2 and Y3 axes, parallel to the bridges.

Enlarged cut-outs 41 are formed in the body at the ends of the slots to prevent the formation of facets and membranes across the slots due to the crystallographic nature of the material. These areas are preferably formed at angles to the slots, and faceting and/or membraning tends to occur within them rather than in the slots themselves. This makes it possible to etch narrower slots, which permits a more compact geometry within the parts as well as permitting a more compact layout of parts within a wafer. This results in better performance and more parts per wafer.

At the drive and pick-up ends of the tuning fork, the tines come together in crotches 42, 43, each of which has an inner pair of faces 46 that meet at the axis 27 of the fork at angles of about 120 degrees to each other and 60 degrees to the axis. Each of the crotches also includes an outer pair of faces 47 which extend between the inner faces and the tines, at angles of about 30 degrees to the axis. Each of the faces lies in a crystallographic plane of the quartz, with the inner faces lying in the Y2 and Y3 planes and the outer faces lying in the X2 and X3 planes. The crotches 42, 43 are wider in dimension between the isolation slots and the faces of the crotches than the side portions 49 of the frame, which increases the signal produced by the tuning fork.

In the embodiment illustrated, drive tines 28 and masses 36 are made thicker and heavier than pick-up tines 29 and masses 37, and drive crotch area 42 is wider and stiffer than pick-up crotch area 43. The width of the drive tines is less than that of crotch area 45 so that the crotch area is relatively stiff. The taper of the drive tines is selected to make the bending as uniform as possible along the length of the tines.

The pick-up tines 29 and masses 37 are selected to maximize charge due to bending in the pick-up direction, ie. perpendicular to the plane of the tines, by making the bending uniform along the length of the tines to spread out charge collection and thereby make the fork more efficient. The pick-up tines and masses can be adjusted independently of the drive mode frequency to provide the proper pick-up frequency, and the node of the pick-up mode oscillation is adjusted to make the nodal line (zero deflection) occur at the mounting point. Such adjustment of the nodal line position greatly reduces coupling from external vibrations into the pick-up mode of oscillation. Such adjustment is not readily achievable in other tuning fork designs because of their lack of flexibility.

In operation, the drive tines are driven to oscillate at the natural frequency of the drive mode, with the drive tines oscillating out-of-phase with each other in the x-direction. When the driven tuning fork is subject to rotation about the axis of the tines, i.e. axis 27, the Coriolis force causes the tines to deflect out of the plane of the tuning fork. This deflection excites the pick-up mode of oscillation. The Coriolis force is proportional to the momentum of the drive tines. The pick-up tines, oscillating in the pick-up mode, generate charge along their length due to their displacement. This charge output is linearly proportional to the applied rate of rotation, and can be measured by methods known in the art as discussed, for example, in U.S. Pat. No. 5,396,144, the disclosure of which is incorporated herein by reference. The output of the tuning fork is maximized by maximizing the momentum of the oscillating drive tines and by optimizing the charge output characteristics of the pick-up tines.

The invention has a number of important features and advantages. The tapered tines and the weights permit performance of the tuning fork to be optimized to a far greater extent than is possible with tuning forks of the prior art with straight tines of constant cross section. The tapering of the tines produces more charge toward the tips of the tines and results in a more efficient tuning fork than the prior art devices where the stress is concentrated toward the base of the tines.

Thus, for example, deflection of the tips of the tines can be reduced while maintaining or increasing both the charge developed on the electrodes and the momentum of the tines. This results in a higher quality factor or "Q" when the fork is driven by an applied voltage, which increases the drive current and permits the drive voltage to be decreased. The reduction in drive voltage results in a reduction of undesired bias offsets.

Spreading the stress along the tines and the improved crotch geometry also reduce the effect of manufacturing inaccuracies and serves to prevent the facets from forming in the corners between the crotch and the tines. Reducing the local level of stress at the corners of the crotch allows the tines to operate at an increased level of stress, which results in more charge being developed. The increase in stress occurs along the entire length of the tines, which enables the outer portions of the electrodes to be utilized more fully, resulting in more charge being developed and, hence, a more efficient electrode design.

The increased output makes it possible to reduce the size of the tuning fork, which means that more forks can be produced from a wafer of given size without sacrificing the performance of the forks. In addition, making the side portions of the frame narrower than the crotches results in an additional increase in signal.

The enlarged cut-out areas at the ends of the isolation slots make it possible to make the slots narrower without the formation of undesirable bridging and/or membranes within the slots.

Having the faces of the crotch areas oriented with the crystallographic axes minimizes the formation of facets or bridges in the crotch areas. The absence of a central segment which is perpendicular to the axis of the fork reduces facet formation and permits the length of the crotch segments to be greater for a fork of given width, which further reduces the possibility of bridging across the crotch segments and the tines.

Having the bridges aligned along the crystallographic y-axes allows the structure of the crotch area to be made wider and generally stiffer, which reduces the effect of any remaining facets in the crotch area.

While the invention has been described with specific reference to a double ended tuning fork, it is also applicable to single ended forks.

It is apparent from the foregoing that a new and improved tuning fork has been provided. While only certain presently preferred embodiments have been described in detail, as will be apparent to those familiar with the art, certain changes and modifications can be made without departing from the scope of the invention as defined by the following claims.

What is claimed is:

1. A tuning fork for use in an inertial rate sensor, comprising a body of piezoelectric material having a base and a pair of tapered tines which extend from the base and decrease in lateral dimension from the base toward the tips of the tines such that when the tines are driven at resonance, the stress level is relatively uniform along the length of the tines.

2. The tuning fork of claim 1 wherein the body is fabricated of quartz.

3. A double ended tuning fork for use in an inertial rate sensor formed as a unitary structure of piezoelectric material, comprising a frame having a central opening, a mounting pad disposed in the opening, relatively thin bridges interconnecting the mounting pad and the frame, a pair of tapered drive tines extending from a first crotch at one end of the frame and decreasing in lateral dimension from the first crotch toward the tips of the tines, and a pair of tapered pick-up tines extending from a second crotch at a second end of the frame and decreasing in lateral dimension from the second crotch toward the tips of the tines, the pick-up mode oscillation being adjusted so that the nodal line of the pick-up mode passes through the mounting pad.

4. The tuning fork of claim 3 wherein the structure is fabricated of quartz.

5. A double ended tuning fork for use in an inertial rate sensor formed as a unitary structure of piezoelectric material, comprising a frame having a central opening, a mounting pad disposed in the opening, relatively thin bridges interconnecting the mounting pad and the frame and extending at angles of about 60 degrees to the longitudinal axis of the tuning fork in directions parallel to axes of the quartz, a pair of tapered drive tines extending from a first crotch at one end of the frame and decreasing in lateral dimension from the first crotch toward the tips of the tines, and a pair of tapered pick-up tines extending from a second crotch at a second end of the frame and decreasing in lateral dimension from the second crotch toward the tips of the tines, the pick-up mode oscillation being adjusted to so that the nodal line of the pick-up mode passes through the mounting pad.

6. A tuning fork for use in an inertial rate sensor, comprising a body of piezoelectric material having a base and a pair of tapered tines which extend from the base and decrease in lateral dimension from the base toward the tips of the tines, and weights of increased lateral dimension at the tips of the tapered tines, the taper of the tines and the size of the weights being such that when the tines are driven at resonance, the stress level is relatively uniform along the length of the tines.

7. A tuning fork for use in an inertial rate sensor, comprising a body of piezoelectric material having a base and a pair of tapered tines which extend from the base and decrease in lateral dimension from the base toward the tips of the tines, weights of increased lateral dimension at the tips of the tapered tines, and short, straight neck sections between the tips of the tines and the weights.

8. A tuning fork for use in an inertial rate sensor formed as a unitary structure of piezoelectric material, comprising a base, a pair of tapered tines which extend from the base and decrease in lateral dimension from the base toward the tips of the tines, and weights of increased lateral dimension at the tips of the tines.

* * * * *